US011489509B2

(12) United States Patent
Kawasaki (10) Patent No.: US 11,489,509 B2
(45) Date of Patent: Nov. 1, 2022

(54) ACOUSTIC WAVE DEVICE AND ACOUSTIC WAVE MODULE INCLUDING THE SAME

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 437 days.

(21) Appl. No.: 16/789,460

(22) Filed: Feb. 13, 2020

(65) Prior Publication Data

US 2020/0186121 A1 Jun. 11, 2020

Related U.S. Application Data

(63) Continuation of application No. PCT/JP2018/025823, filed on Jul. 9, 2018.

(30) Foreign Application Priority Data

Aug. 31, 2017 (JP) .............................. JP2017-166611

(51) Int. Cl.
*H03H 9/02* (2006.01)
*H03H 9/05* (2006.01)
(Continued)

(52) U.S. Cl.
CPC .......... *H03H 9/1092* (2013.01); *H03H 9/059* (2013.01); *H03H 9/25* (2013.01)

(58) Field of Classification Search
None
See application file for complete search history.

(56) References Cited

U.S. PATENT DOCUMENTS 8,067,879 B2 * 11/2011 Kudo ................... H03H 9/1092
310/313 R
8,748,755 B2 * 6/2014 Inoue ................... H03H 9/6483
257/730

(Continued)

FOREIGN PATENT DOCUMENTS

JP 2006-345075 A 12/2006
JP 2006-352430 A 12/2006
(Continued)

OTHER PUBLICATIONS

Official Communication issued in International Patent Application No. PCT/JP2018/025823, dated Aug. 14, 2018.

*Primary Examiner* — Kenneth B Wells
(74) *Attorney, Agent, or Firm* — Keating & Bennett, LLP (57) ABSTRACT

An acoustic wave device includes a piezoelectric substrate, functional elements, an outer peripheral support layer, a cover portion, and a protective layer covering the cover portion. A hollow space is defined by the piezoelectric substrate, the outer peripheral support layer, and the cover portion, and the functional elements are disposed in the hollow space. The acoustic wave device further includes an under bump metal layer, a wiring pattern, and a through-electrode that connects these elements. In the protective layer, a through-hole to be filled with a conductor to electrically connect a solder ball and the under bump metal layer is provided. The outer peripheral support layer includes a protruding portion protruding to the hollow space. When the acoustic wave device is seen in plan view, at least a portion of the through-hole overlaps the hollow space, and an end portion of the protruding portion overlaps an inner region of the through-hole.

20 Claims, 7 Drawing Sheets

(51) Int. Cl.
  *H03H 9/10*   (2006.01)
  *H03H 9/64*   (2006.01)
  *H03H 9/72*   (2006.01)
  *H03H 9/25*   (2006.01)

(56) References Cited

U.S. PATENT DOCUMENTS

| | | | |
|---|---|---|---|
| 9,264,016 B2 * | 2/2016 | Tsuda | H03H 3/08 |
| 9,831,850 B2 * | 11/2017 | Kuroyanagi | H03H 9/02559 |
| 10,659,001 B2 * | 5/2020 | Yamamoto | H03H 9/145 |
| 10,931,258 B2 * | 2/2021 | Kawasaki | H01L 23/02 |
| 11,134,344 B2 * | 9/2021 | Kawasaki | H04R 31/006 |
| 11,139,795 B2 * | 10/2021 | Kawasaki | H03H 9/25 |
| 11,177,788 B2 * | 11/2021 | Fujimori | H03H 9/1071 |
| 2013/0335171 A1 | 12/2013 | Yamato et al. | |
| 2014/0042870 A1 | 2/2014 | Ohashi et al. | |
| 2014/0125197 A1 | 5/2014 | Fujita et al. | |
| 2016/0204762 A1 | 7/2016 | Lee | |
| 2018/0013055 A1 | 1/2018 | Metzger et al. | |
| 2018/0019727 A1 | 1/2018 | Ando et al. | |

FOREIGN PATENT DOCUMENTS

| | | |
|---|---|---|
| JP | 2008-072617 A | 3/2008 |
| JP | 2013-225749 A | 10/2013 |
| JP | 2015-039209 A | 2/2015 |
| JP | 2016-131360 A | 7/2016 |
| JP | 2018-014717 A | 1/2018 |
| WO | 2012/120968 A1 | 9/2012 |
| WO | 2012/144370 A1 | 10/2012 |
| WO | 2016/134803 A1 | 9/2016 |

* cited by examiner

ACOUSTIC WAVE DEVICE AND ACOUSTIC WAVE MODULE INCLUDING THE SAME

CROSS REFERENCE TO RELATED APPLICATIONS

This application claims the benefit of priority to Japanese Patent Application No. 2017-166611 filed on Aug. 31, 2017 and is a Continuation Application of PCT Application No. PCT/JP2018/025823 filed on Jul. 9, 2018. The entire contents of each application are hereby incorporated herein by reference.

BACKGROUND OF THE INVENTION

1. Field of the Invention

The present invention relates to an acoustic wave device and an acoustic wave module including the acoustic wave device and, in particular, to a package structure of an acoustic wave device.

2. Description of the Related Art

In electronic apparatuses such as mobile phones or smart phones, acoustic wave devices including surface acoustic wave (SAW) resonators or bulk acoustic wave (BAW) resonators are used. In recent years, electronic apparatuses have been reduced in size and thickness, and accordingly reduction in size and height of acoustic wave devices has been required. To achieve this, a wafer level package (WLP) structure, which uses the chip itself of an acoustic wave device as a package, has been proposed.

An acoustic wave device having a general WLP structure has a configuration such that a plurality of functional elements are disposed on a piezoelectric substrate in a hollow space that is formed by the piezoelectric substrate, an outer peripheral support layer disposed around a surface of the piezoelectric substrate, and a cover portion provided on the outer peripheral support layer. In a case of a surface acoustic wave (SAW) device, an interdigital transducer (IDT) is disposed as a functional element.

In an acoustic wave device, when the dimension of the outer peripheral support layer in the width direction is increased, the proportion of an area that the outer peripheral support layer occupies on the main surface of the piezoelectric substrate increases. Therefore, the space for disposing functional elements such as an IDT electrode is reduced, and the degree of freedom in design decreases. In order to achieve further reduction in size of an acoustic wave device, it is desirable to increase the proportion of an area (hollow space) in which functional elements such as an IDT electrode can be disposed on the piezoelectric substrate. In order to enlarge the hollow space, it is necessary to reduce the proportion of the outer peripheral support layer on the piezoelectric substrate. In this case, however, it is also necessary to prevent a decrease in rigidity against an external pressure.

SUMMARY OF THE INVENTION

Preferred embodiments of the present invention provide an increase to an area in which functional elements can be disposed in an acoustic wave device while maintaining sufficient rigidity and resistance against an external pressure.

An acoustic wave device according to a preferred embodiment of the present invention includes a piezoelectric substrate, a plurality of functional elements that are provided on the piezoelectric substrate, an outer peripheral support layer, a cover portion, and a protective layer that covers the cover portion. The outer peripheral support layer is disposed on the piezoelectric substrate around a region in which the plurality of functional elements are provided. The cover portion faces the piezoelectric substrate with the outer peripheral support layer interposed therebetween. A hollow space is defined by the piezoelectric substrate, the outer peripheral support layer, and the cover portion, and the plurality of functional elements are disposed in the hollow space. The acoustic wave device further includes first and second conductive portions and a wiring pattern. The first conductive portion is provided between the cover portion and the protective layer. The wiring pattern is disposed on the piezoelectric substrate and is electrically connected to at least one of the plurality of functional elements. The second conductive portion connects the first conductive portion and the wiring pattern to each other. In the protective layer, a through-hole that is to be filled with a conductor to electrically connect a connection terminal provided outside the acoustic wave device and the first conductive portion to each other is provided. The outer peripheral support layer includes a protruding portion that protrudes toward the hollow space. When the acoustic wave device is seen in plan view, at least a portion of the through-hole overlaps the hollow space and an end portion of the protruding portion overlaps an inner region of the through-hole.

An acoustic wave device according to a preferred embodiment of the present invention includes a piezoelectric substrate, a plurality of functional elements that are provided on the piezoelectric substrate, an outer peripheral support layer, a cover portion, a protective layer that covers the cover portion, and an inner support layer. The outer peripheral support layer is disposed on the piezoelectric substrate around a region in which the plurality of functional elements are provided. The cover portion faces the piezoelectric substrate with the outer peripheral support layer interposed therebetween. A hollow space is defined by the piezoelectric substrate, the outer peripheral support layer, and the cover portion, and the plurality of functional elements are disposed in the hollow space. The acoustic wave device further includes first and second conductive portions and a wiring pattern. The first conductive portion is provided between the cover portion and the protective layer. The wiring pattern is disposed on the piezoelectric substrate and is electrically connected to at least one of the plurality of functional elements. The second conductive portion connects the first conductive portion and the wiring pattern. In the protective layer, a through-hole that is to be filled with a conductor to electrically connect a connection terminal provided outside the acoustic wave device and the first conductive portion to each other is provided. The internal support layer is disposed in the hollow space and supports the cover portion. When the acoustic wave device is seen in plan view, at least a portion of the through-hole overlaps the hollow space, and an end portion of the internal support layer overlaps an inner region of the through-hole.

An acoustic wave device according to a preferred embodiment of the present invention includes a piezoelectric substrate, a functional element disposed on the piezoelectric substrate, an outer peripheral support layer, a cover portion, a protective layer, a wiring electrode, first to third conductive portions, and an internal support layer. The outer peripheral support layer is disposed on the piezoelectric substrate and surrounds a region in which the functional element is provided when the acoustic wave device is seen in plan view. The cover portion is supported by the outer peripheral support layer and is disposed above the functional element. The protective layer is disposed on the cover portion and a through-hole is provided in a portion of the protective layer. The wiring electrode is disposed on the piezoelectric substrate and is connected to the functional element. The first conductive portion is disposed between the cover portion and the protective layer. The second conductive portion is connected to the wiring electrode and the first conductive portion. At least a portion of the third conductive portion is disposed in the through-hole, and the third conductive portion is connected to the first conductive portion. The internal support layer is disposed between the cover portion and the piezoelectric substrate in a region that is surrounded by the outer peripheral support layer when the acoustic wave device is seen in plan view. At least a portion of the internal support layer overlaps the through-hole when the acoustic wave device is seen in plan view.

With preferred embodiments of the present invention, it is possible to increase an area in which functional elements can be disposed in an acoustic wave device while maintaining sufficient rigidity against an external pressure.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described in detail with reference to the drawings. In the drawings, elements that are the same as or similar to each other will be denoted by the same reference numerals and descriptions of such elements will not be repeated.

First Preferred Embodiment

Figure 1:
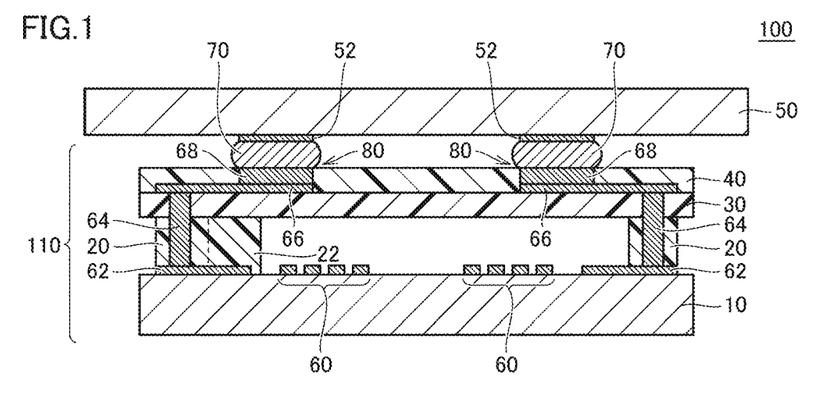
FIG. 1 is a cross-sectional view of an acoustic wave module in which an acoustic wave device according to a first preferred embodiment of the present invention is provided.

FIG. 1 is a cross-sectional view of an acoustic wave module 100 in which an acoustic wave device 110 according to a first preferred embodiment of the present invention is provided on a mount substrate 50. As an example of an acoustic wave device according to the present preferred embodiment, a surface acoustic wave device that includes an IDT electrode as a functional element will be described. However, an acoustic wave device may be a device that uses a bulk acoustic wave.

Referring to FIG. 1, the acoustic wave device 110 includes a piezoelectric substrate 10, an outer peripheral support layer 20, a cover portion 30, a protective layer 40, functional elements 60, and connection terminals 70.

The piezoelectric substrate 10 is preferably made of a piezoelectric single crystal material, such as, for example, lithium tantalate (LiTaO$_3$), lithium niobate (LiNbO$_3$), alumina, silicon (Si), or sapphire; or a piezoelectric multi-layer material composed of LiTaO$_3$ or LiNbO$_3$. The plurality of functional elements 60 are disposed on the piezoelectric substrate 10. The functional elements 60 include a pair of IDT electrodes made of an electrode material that is preferably, for example, an elemental metal that is at least one of aluminum, copper, silver, gold, titanium, tungsten, platinum, chrome, nickel, and molybdenum; an alloy including one of these metals as a main component; or the like. A surface acoustic wave resonator is defined by the piezoelectric substrate 10 and the IDT electrodes.

The outer peripheral support layer 20, which is preferably made of, for example, a resin, is provided on an outer peripheral portion of the main surface of the piezoelectric substrate 10. By disposing the piezoelectric substrate 10 and the cover portion 30 so as to face each other with the outer peripheral support layer 20 therebetween, a hollow space is defined around the plurality of functional elements 60 including the IDT electrodes. Thus, a surface acoustic wave propagates in a portion of the piezoelectric substrate 10 adjacent to the hollow space.

A surface of the cover portion 30 on a side opposite from the hollow space is covered by the protective layer 40 preferably made of, for example, an insulating resin such as an epoxy resin. An under bump metal layer 66 is provided between the cover portion 30 and the protective layer. Through-holes 80 are provided in the protective layer 40.

Each of the through-holes 80 is located at a position where at least a portion thereof overlaps the hollow space when the acoustic wave device 110 is seen in plan view.

A wiring pattern 62 to electrically connect the functional elements 60 to each other is provided on the main surface of the piezoelectric substrate 10. The wiring pattern 62 is electrically connected to the under bump metal layer 66 via through-electrodes (vias) 64 that extend through the outer peripheral support layer 20 and the cover portion 30. The under bump metal layer 66 extends from connection portions with the through-electrodes 64 in the inward direction of the acoustic wave device 110, and is connected to the connection terminals 70 via conductors 68 with which the through-holes 80 provided in the protective layer 40 are filled. The connection terminals 70 are electrically connected to a wiring pattern 52 on the mount substrate 50.

In the acoustic wave device 110 according to the first preferred embodiment, protruding portions 22, which are portions of the outer peripheral support layer 20 that protrude toward the hollow space, are provided. The protruding portions 22 are disposed such that end portions thereof overlap the through-holes 80 when the acoustic wave device 110 is seen in plan view. As described below, the protruding portions 22 are configured to receive a stress that is applied via the connection terminals 70 from the outside in the process of mounting the acoustic wave device 110 onto the mount substrate 50, and thus deformation of the cover portion 30 is reduced or prevented.

Here, a stress that is applied to the acoustic wave device 110 via the connection terminals 70 will be described. In the process of mounting the acoustic wave device 110 on the mount substrate 50 (reflow process), in general, the acoustic wave device 110 is brought into close contact with the mount substrate 50 on which solder balls (the connection terminals 70) have been disposed beforehand, the acoustic wave device 110 and the mount substrate 50 in this state are conveyed into a high-temperature furnace to melt the solder, and then the acoustic wave device 110 and the mount substrate 50 are connected to each other by cooling these.

At this time, the solder balls are disposed on the mount substrate 50 so as to protrude from the mount substrate 50, and the protruding portions (projecting portions) of the solder balls contact the acoustic wave device 110 when the acoustic wave device 110 is brought into close contact with the mount substrate 50. A solder ball generally includes a metal filler, the metal filler presses the acoustic wave device 110, and thus a pressure is locally applied to the acoustic wave device 110.

Figure 2:
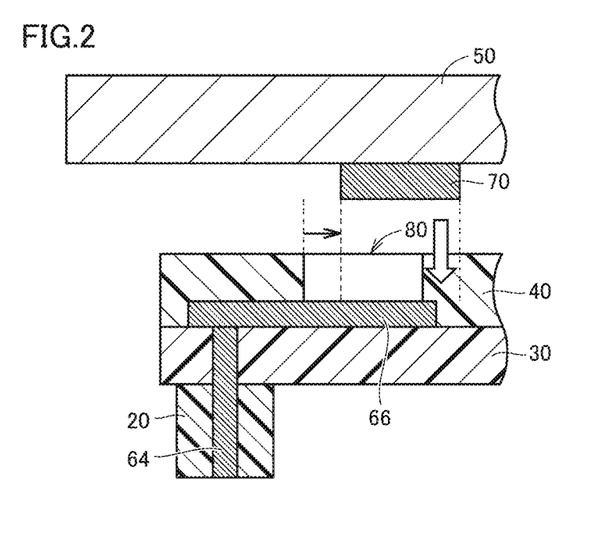
FIG. 2 is a first view illustrating a force applied from a mount substrate to the acoustic wave device in a mounting process.
Figure 3:
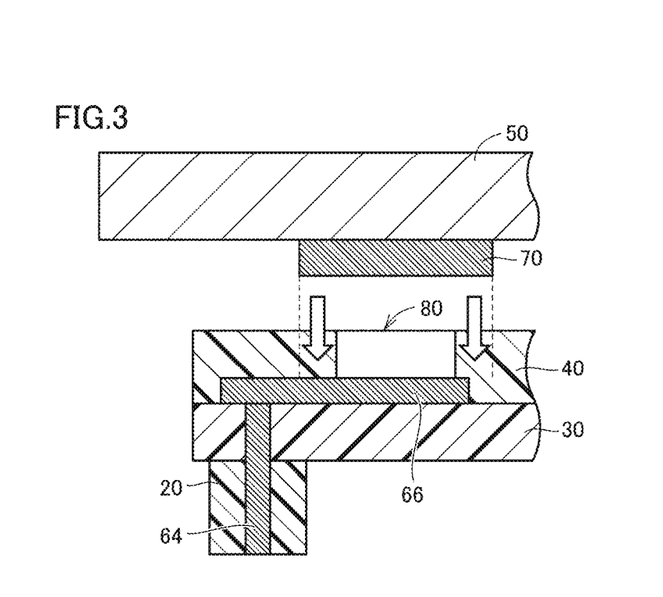
FIG. 3 is a second view illustrating a force applied from a mount substrate to the acoustic wave device in a mounting process.

Even in a case where each of the through-holes 80 of the protective layer 40 is not filled with a conductor and the projecting portion of the solder ball can be contained in the through-hole 80 when the acoustic wave device 110 is brought into close contact with the mount substrate 50, if displacement occurs between the projecting portion and the through-hole 80 as illustrated in FIG. 2 or if the dimension of the projecting portion is larger than the dimension of the through-hole 80 as illustrated in FIG. 3, a pressure is locally applied to an edge portion of the through-hole 80.

In a case where the dimension of the outer peripheral support layer 20 in the width direction is reduced in order to widen the hollow space, if a pressure is locally applied by the projecting portion of the solder ball as described above, the cover portion 30 may deform and the deformed cover portion 30 may make contact with the functional elements 60, and the contact may lead to undesirable characteristics or breakage.

Moreover, due to a moment generated by deformation of the cover portion 30 and a local pressure, a stress may be applied also to a connection portion between the through-electrode 64 and the under bump metal layer 66, and the stress may lead to loose connection or breakage.

In the first preferred embodiment, protruding portions are provided in portions of the outer peripheral support layer 20, and end portions of the protruding portions are located in regions of the through-holes 80. Because the protruding portions of the outer peripheral support layer 20 can support a stress that is generated by a pressure that is locally applied, deformation of the cover portion 30 can be reduced or prevented.

Figure 4:
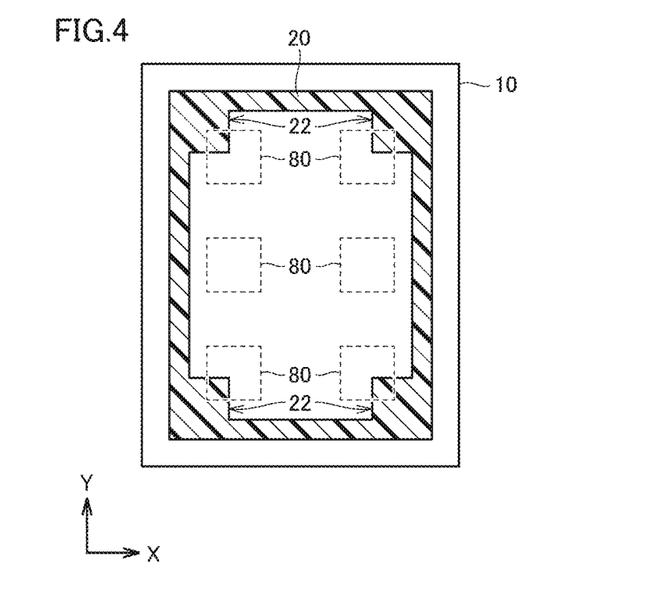
FIG. 4 illustrates an example of an arrangement of protruding portions of an outer peripheral support layer when the acoustic wave device of FIG. 1 is seen in plan view.
Figure 5:
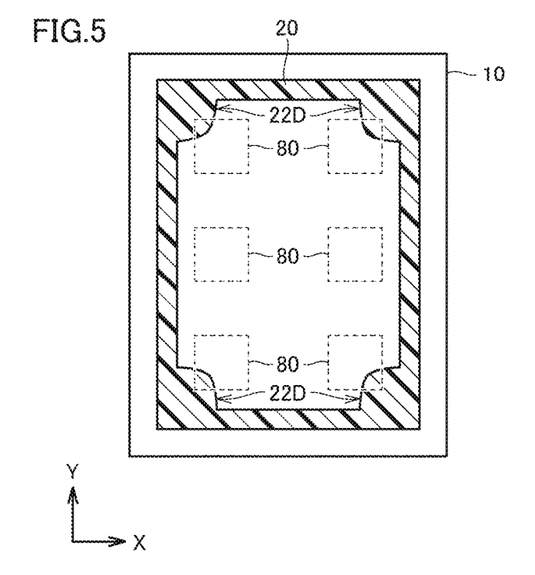
FIG. 5 illustrates another example of an arrangement of protruding portions of an outer peripheral support layer when the acoustic wave device of FIG. 1 is seen in plan view.
Figure 6:
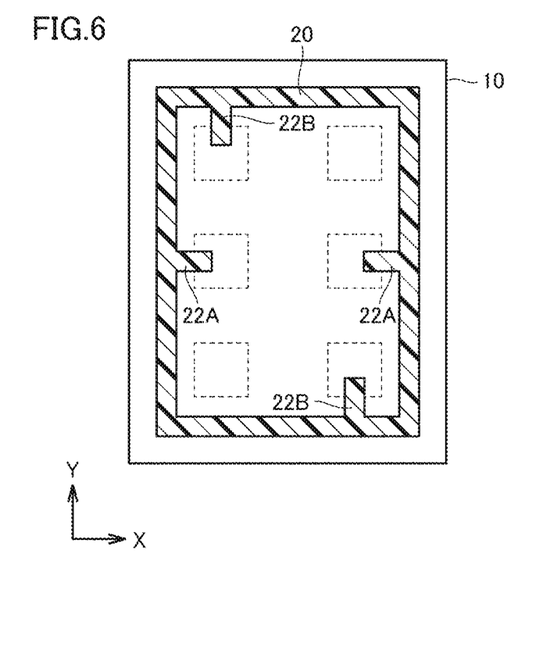
FIG. 6 illustrates another example of an arrangement of protruding portions of an outer peripheral support layer when the acoustic wave device of FIG. 1 is seen in plan view.

FIGS. 4 to 6 each illustrate an example of an arrangement of the protruding portions of the outer peripheral support layer 20 when the acoustic wave device 110 of FIG. 1 is seen in plan view. In each of FIGS. 4 to 6, the acoustic wave device 110 has a rectangular or substantially rectangular shape in plan view. However, the planar shape of the acoustic wave device 110 is not limited to this. The planar shape of the acoustic wave device 110 may be a circle, an ellipse, or another polygon, for example. In each of FIGS. 4 to 6 and FIGS. 9 to 12 described below, to facilitate understanding, the cover portion 30 is transparently illustrated and the positions of the through-holes 80 are shown by broken lines.

In FIG. 4, the protruding portions 22 are provided at the four corners of the rectangular or substantially rectangular outer peripheral support layer 20. In the configuration shown in FIG. 4, each of the protruding portions 22 receives a portion of a stress in the transversal direction (the X-axis direction in the figure) and the longitudinal direction (the Y-axis direction). By reducing the dimension in the width direction of portions of the outer peripheral support layer 20 in which the protruding portions 22 are not provided (the dimension in the Y-axis direction for the short sides, and the dimension in the X-axis direction for the long sides), an area occupied by the hollow space is increased. Although an example in which the protruding portions 22 have rectangular or substantially rectangular shapes is illustrated in FIG. 4, the shapes of the protruding portions are not limited to rectangular shapes, and may be curved as in the case of protruding portions 22D shown in FIG. 5.

The protruding portions need not be located at the four corners as in FIGS. 4 and 5, and may be located in any appropriate way as long as the protruding portions can support a stress that is generated. FIG. 6 illustrates an example of configuration in which protruding portions 22A and 22B are disposed at portions of respective sides of a rectangular or substantially rectangular outer peripheral support layer 20.

In FIG. 6, the protruding portions 22A, which are provided at the long sides, support a stress in the X-axis direction, and the protruding portions 22B, which are provided at the short sides, support a stress in the Y-axis direction. Although an example in which one protruding portion is provided on each side is illustrated in FIG. 6, a plurality of protruding portions may be provided on each side. However, when the number of protruding portions is increased, although an allowable stress increases, a region in which functional elements can be disposed becomes limited, because an area occupied by the support layer in the hollow space increases. Therefore, preferably, the number of protruding portions is determined in accordance with the magnitude of an estimated stress and an allowable stress for each protruding portion.

Also with the structure illustrated in FIG. 6, the protruding portions 22A and 22B can respectively receive an X-axis-direction component and a Y-axis-direction component of a load applied to the acoustic wave device 110 from the outside, and the widths of portions of the outer peripheral support layer 20 in which the protruding portions 22A and 22B are not provided can be reduced. Therefore, the hollow space for the functional elements 60 can be enlarged while maintaining the rigidity of the acoustic wave device 110 against an external pressure.

Figure 7A:
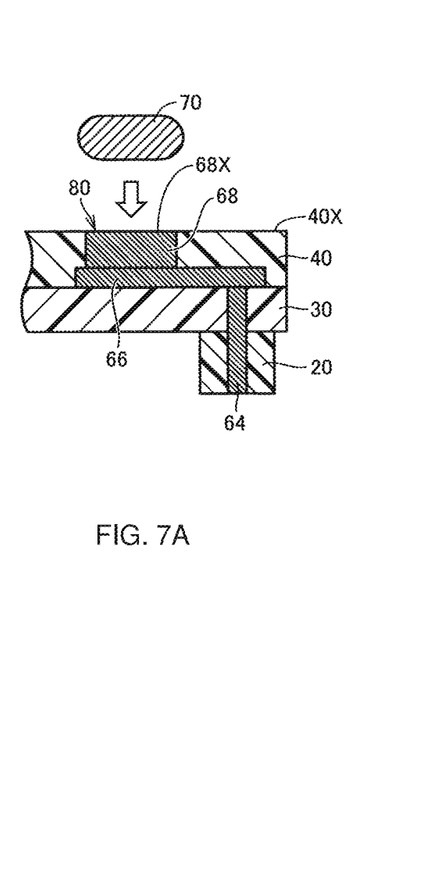
FIGS. 7A to 7C illustrate configurations of a through-hole provided in a protective layer.
Figure 7B:
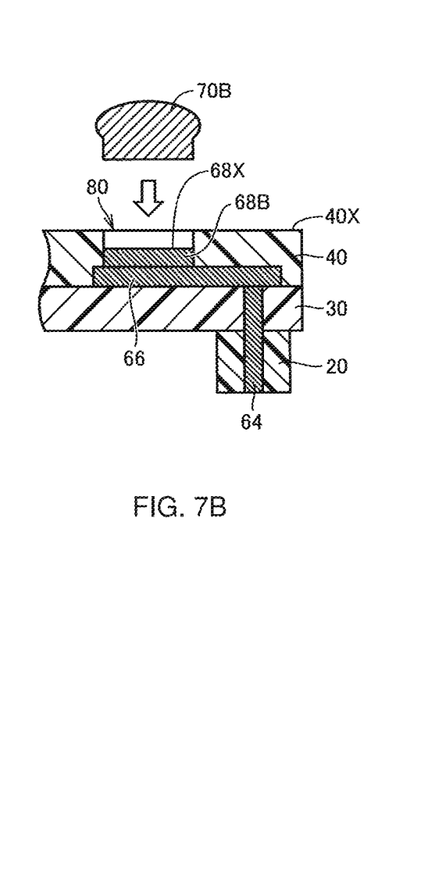
Figure 7C:
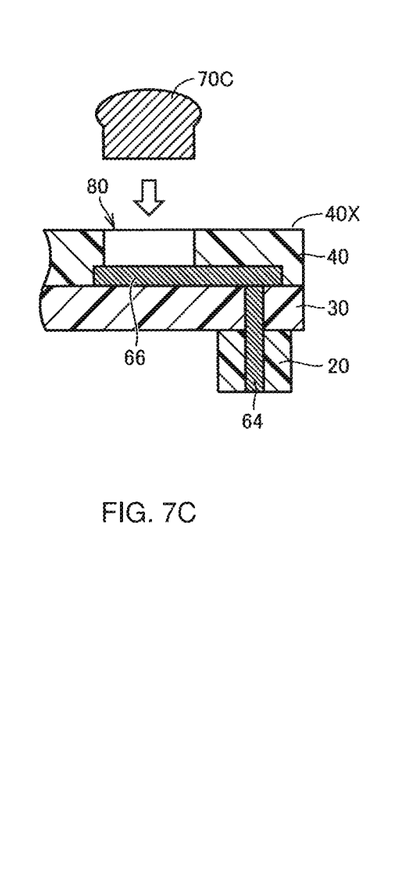

In the configuration described above with reference to FIG. 1, as illustrated in FIG. 7A, the entire or substantially the entire through-hole 80 of the protective layer 40 is filled with the conductor 68, and a solder ball that is the connection terminal 70 is connected to the conductor 68. However, as illustrated in FIG. 7C, the through-hole 80 need not be filled with a conductor at all, or as illustrated in FIG. 7B, the through-hole 80 may be filled with a conductor 68B to the height of a portion of the through-hole 80. In other words, the height of a surface 68X of each of the conductors 68 and 68B in the through-holes 80 in the Z-axis direction (the thickness direction of the acoustic wave device 110) may be same or substantially the same as the height of a surface 40X of the protective layer 40 in the Z-axis direction, or a portion of the surface 68X may be lower than the height of the surface 40X of the protective layer 40. In the cases illustrated in FIGS. 7B and 7C, vacant portions of the through-holes 80 are to be respectively filled with melted solder 70B and melted solder 70C.

Also in a case where the planar shape of the acoustic wave device is not rectangular, by providing the protruding portions of the outer peripheral support layer so as to receive a stress component in a first direction (for example, the X-axis direction) and a stress component in a second direction perpendicular to the first direction (for example, the Y-axis direction) when the acoustic wave device is seen in plan view, advantages similar to those described above are obtained.

Second Preferred Embodiment

In each of the configurations described above in the first preferred embodiment, the protruding portions, which are provided in the outer peripheral support layer 20, receive a stress.

In each of configurations described below in a second preferred embodiment of the present invention, in addition to the outer peripheral support layer, an internal support layer is disposed in the hollow space, and the internal support layer receives a partial stress component.

Figure 8:
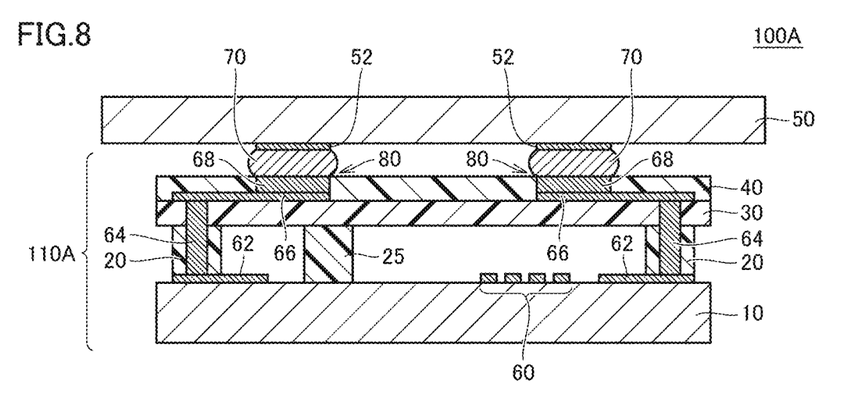
FIG. 8 is a cross-sectional view of an acoustic wave module in which an acoustic wave device according to a second preferred embodiment of the present invention is provided.

FIG. 8 is a cross-sectional view of an acoustic wave module 100A in which an acoustic wave device 110A according to the second preferred embodiment is provided. In the cross section illustrated in FIG. 8, although a protruding portion is not provided in the outer peripheral support layer 20, an internal support layer 25 is provided in the hollow space. The internal support layer 25 is disposed such that an end portion thereof overlaps a region of a through-hole 80 when the acoustic wave device 110A is seen in plan view. The internal support layer 25 can receive a stress in the horizontal direction in FIG. 8.

Figure 9:
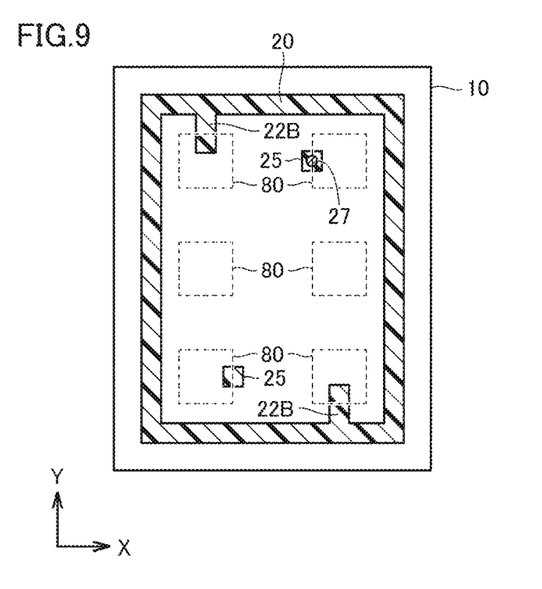
FIG. 9 illustrates a first example of an arrangement of an outer peripheral support layer and an internal support layer when the acoustic wave device of FIG. 8 is seen in plan view.

FIG. 9 illustrates an example of an arrangement of the outer peripheral support layer 20 and internal support layers 25 when the acoustic wave device 110A of FIG. 8 is seen in plan view. In FIG. 9, the internal support layers 25 provide the function of the protruding portions 22A to receive a stress in the X-axis direction in the plan view of FIG. 6 shown in the first preferred embodiment. Regarding a stress in the Y-axis direction, protruding portions 22B provided at the short sides of the outer peripheral support layer 20 receive the stress in the same or similar way as in FIG. 6.

The internal support layers 25 may receive a stress in the Y-axis direction, instead of a stress in the X-axis direction. Alternatively, the internal support layers 25 may receive both of a stress in the X-axis direction and a stress in the Y-axis direction. As illustrated in FIG. 9, a through-electrode 27 may be provided in an internal support layer 25.

In the configuration illustrated in FIG. 9, the internal support layers 25 are provided to receive a stress. However, for example, in a configuration in which an internal support layer is provided for another purpose, a protruding portion may be provided in the internal support layer, and a portion of the protruding portion may overlap a through-hole when the acoustic wave device is seen in plan view. In FIG. 9, end portions of the protruding portions 22B overlap the through-holes 80.

Figure 10:
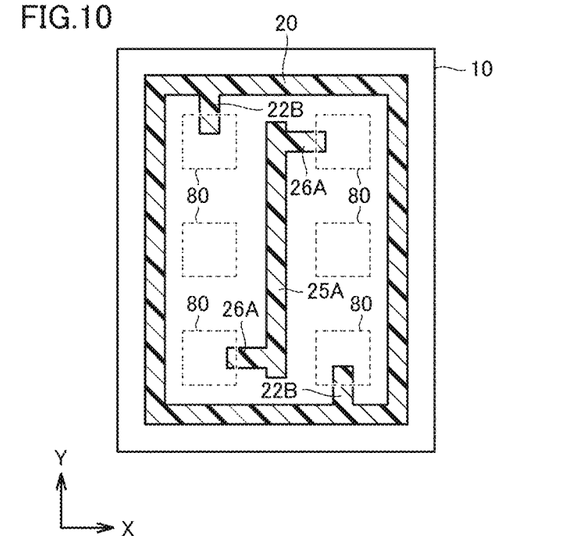
FIG. 10 illustrates a second example of an arrangement of an outer peripheral support layer and an internal support layer when the acoustic wave device of FIG. 8 is seen in plan view.
Figure 11:
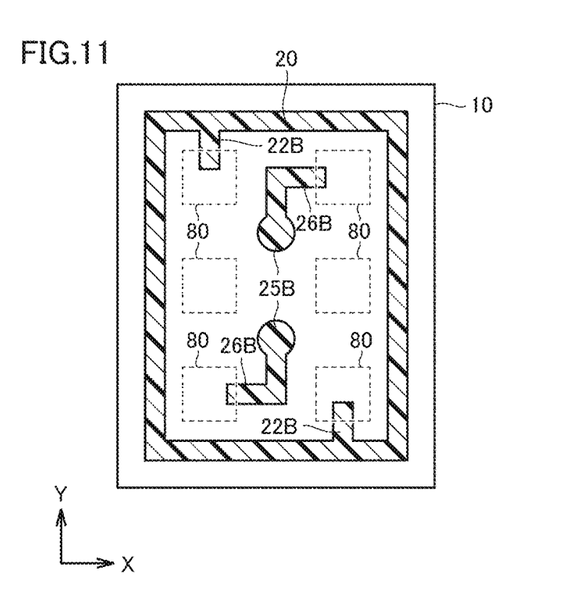
FIG. 11 illustrates a third example of an arrangement of an outer peripheral support layer and an internal support layer when the acoustic wave device of FIG. 8 is seen in plan view.
Figure 12:
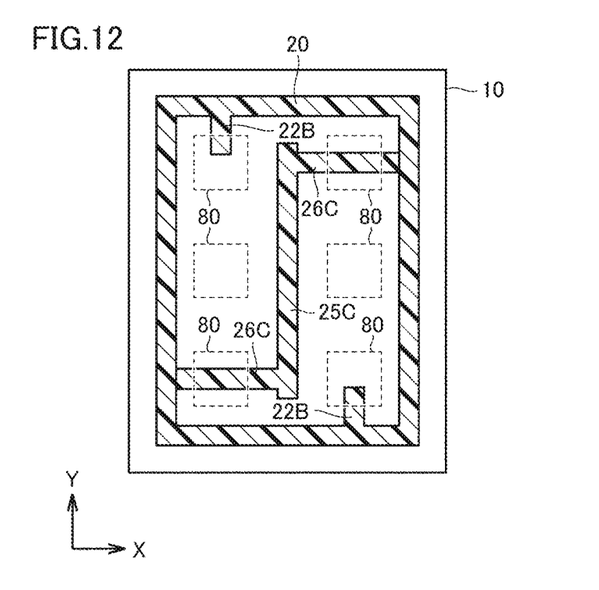
FIG. 12 illustrates a fourth example of an arrangement of an outer peripheral support layer and an internal support layer when the acoustic wave device of FIG. 8 is seen in plan view.

FIG. 10 illustrates an exemplary configuration in which an internal support layer 25A extends in the hollow space in the Y-axis direction in FIG. 10 and in which protruding portions 26A to receive a stress in the X-axis direction are provided. FIG. 11 illustrates an example of a case where columnar internal support layers 25B are provided in the hollow space. In this case, protruding portions 26B to receive a stress in the X-axis direction from the columnar internal support layers 25B are provided. FIG. 12 illustrates an example in which protruding portions 26C extend to an outer peripheral support layer from an internal support layer 25C, which extends in the Y-axis direction in FIG. 11, and portions of the protruding portions 26C overlap through-holes 80. The protruding portions 26A to 26C are each a portion of an internal support layer.

Also with the configurations illustrated in FIGS. 10 to 12, it is possible to set the hollow space to be wide while maintaining rigidity because the protruding portions of the internal support layer receive a stress in a predetermined direction. Also in FIGS. 10 to 12, the protruding portions of the internal support layer may receive a stress in the Y-axis direction, instead of or in addition to a stress in the X-axis direction.

Third Preferred Embodiment

In the configurations described above in the first preferred embodiment and the second preferred embodiment, the through-electrodes 64, which are provided in the outer peripheral support layer 20, connect the under bump metal layer 66, which is provided between the cover portion 30 and the protective layer 40, and the wiring pattern 62 on the piezoelectric substrate 10 to each other. In a configuration described below in a third preferred embodiment of the present invention, conductors that connect the under bump metal layer 66 and the wiring pattern 62 to each other are provided on side surfaces of the outer peripheral support layer 20 and the cover portion 30.

Figure 13:
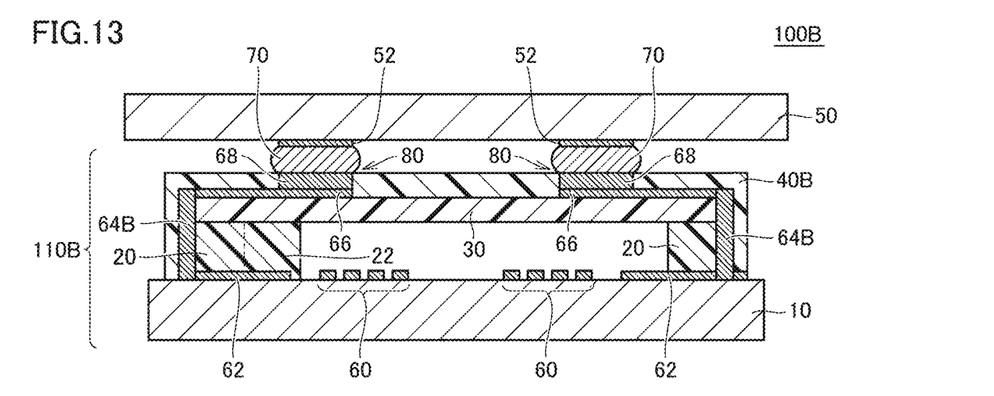
FIG. 13 is a cross-sectional view of an acoustic wave module in which an acoustic wave device according to a third preferred embodiment of the present invention is provided.

FIG. 13 is a cross-sectional view of an acoustic wave module 100B in which an acoustic wave device 110B according to the third preferred embodiment is provided.

Referring to FIG. 13, the under bump metal layer 66 and the wiring pattern 62 are connected to each other via side wiring conductors 64B that are provided on an outer peripheral side surface of the outer peripheral support layer 20. Moreover, a protective layer 40B covers not only the cover portion 30 but also the entire or substantially the entire outer peripheral side surface of the outer peripheral support layer 20. That is, the side wiring conductors 64B are provided between the outer peripheral support layer 20 and the protective layer 40B. Descriptions of elements other than those described above, which are common to those shown in FIG. 1, will not be repeated.

Also in the acoustic wave device 110B illustrated in FIG. 13, protruding portions 22 are provided in the outer peripheral support layer 20, and end portions of the protruding portions 22 are disposed so as to overlap the through-holes 80. Accordingly, also with the third preferred embodiment, as with the first preferred embodiment, it is possible to enlarge the hollow space for the functional elements 60 while maintaining the rigidity of the acoustic wave device 110B against an external pressure.

Although not illustrated in the figures, also with the configuration of the third preferred embodiment, which includes the side wiring conductors 64B, the internal support layer (and protruding portions thereof) may receive a stress, as in the second preferred embodiment.

As heretofore described, according to the present preferred embodiment, an acoustic wave device having a WLP structure has the following configuration: a protruding portion that partially protrudes from an outer peripheral support layer and/or an internal support layer and an end portion of a protruding portion that protrudes from the internal support layer are/is disposed so as to overlap a region of a through-hole when the acoustic wave device is seen in plan view, and the dimension of the outer peripheral support layer in the width direction is reduced. Thus, it is possible to reduce the proportion of an area occupied by the outer peripheral support layer in the acoustic wave device, while receiving a stress due to an external pressure with the protruding portion. Accordingly, it is possible to enlarge a hollow space for functional elements while maintaining the rigidity and resistance of the acoustic wave device against an external pressure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric substrate;
   a plurality of functional elements on the piezoelectric substrate;
   an outer peripheral support layer on the piezoelectric substrate around a region in which the plurality of functional elements are provided;
   a cover portion facing the piezoelectric substrate with the outer peripheral support layer interposed therebetween; and
   a protective layer covering the cover portion; wherein
   a hollow space is defined by the piezoelectric substrate, the outer peripheral support layer, and the cover portion, and the plurality of functional elements are located in the hollow space;
   the acoustic wave device further includes:
   a first conductive portion between the cover portion and the protective layer;
   a wiring pattern on the piezoelectric substrate and electrically connected to at least one of the plurality of functional elements; and
   a second conductive portion connecting the first conductive portion and the wiring pattern to each other;
   in the protective layer, a through-hole to be filled with a conductor to electrically connect a connection terminal provided outside the acoustic wave device and the first conductive portion to each other is provided;
   the outer peripheral support layer includes a protruding portion that protrudes toward the hollow space; and
   when the acoustic wave device is seen in plan view, at least a portion of the through-hole overlaps the hollow space and an end portion of the protruding portion overlaps an inner region of the through-hole.

2. The acoustic wave device according to claim 1, wherein
   when the acoustic wave device is seen in plan view, the outer peripheral support layer has a rectangular or substantially rectangular shape; and
   the protruding portion is located at each of four corners of the outer peripheral support layer.

3. The acoustic wave device according to claim 1, wherein
   when the acoustic wave device is seen in plan view, the outer peripheral support layer has a rectangular or substantially rectangular shape; and
   the protruding portion is located at at least one position on each side of the outer peripheral support layer.

4. The acoustic wave device according to claim 1, wherein
   the protruding portion receives a stress when a pressure is applied to the cover portion; and
   the protruding portion is located at each of a position that receives a stress in a first direction when the acoustic wave device is seen in plan view and a position that receives a stress in a second direction perpendicular or substantially perpendicular to the first direction.

5. The acoustic wave device according to claim 1, further comprising:
   an internal support layer in the hollow space and supporting the cover portion;
   when the acoustic wave device is seen in plan view, a portion of the internal support layer overlaps an inner region of the through-hole.

6. The acoustic wave device according to claim 1, wherein an interdigital transducer (IDT) electrode is included in at least one of the plurality of functional elements, and a surface acoustic wave resonator is defined by the piezoelectric substrate and the IDT electrode.

7. The acoustic wave device according to claim 1, further comprising another conductor with which the through-hole is filled to a height of at least a portion of the through-hole.

8. An acoustic wave module comprising:
   the acoustic wave device according to claim 1; and
   a mount substrate on which the acoustic wave device is mounted.

9. The acoustic wave module according to claim 8, wherein
   when the acoustic wave device is seen in plan view, the outer peripheral support layer has a rectangular or substantially rectangular shape; and
   the protruding portion is located at each of four corners of the outer peripheral support layer.

10. The acoustic wave module according to claim 8, wherein
    when the acoustic wave device is seen in plan view, the outer peripheral support layer has a rectangular or substantially rectangular shape; and
    the protruding portion is located at at least one position on each side of the outer peripheral support layer.

11. The acoustic wave module according to claim 8, wherein
    the protruding portion receives a stress when a pressure is applied to the cover portion; and the protruding portion is located at each of a position that receives a stress in a first direction when the acoustic wave device is seen in plan view and a position that receives a stress in a second direction perpendicular or substantially perpendicular to the first direction.

12. The acoustic wave module according to claim 8, further comprising:
an internal support layer in the hollow space and supporting the cover portion;
when the acoustic wave device is seen in plan view, a portion of the internal support layer overlaps an inner region of the through-hole.

13. The acoustic wave module according to claim 8, wherein an interdigital transducer (IDT) electrode is included in at least one of the plurality of functional elements, and a surface acoustic wave resonator is defined by the piezoelectric substrate and the IDT electrode.

14. The acoustic wave module according to claim 8, further comprising another conductor with which the through-hole is filled to a height of at least a portion of the through-hole.

15. An acoustic wave device comprising:
a piezoelectric substrate;
a plurality of functional elements on the piezoelectric substrate;
an outer peripheral support layer on the piezoelectric substrate around a region in which the plurality of functional elements are provided;
a cover portion facing the piezoelectric substrate with the outer peripheral support layer interposed therebetween; and
a protective layer covering the cover portion; wherein
a hollow space is defined by the piezoelectric substrate, the outer peripheral support layer, and the cover portion, and the plurality of functional elements are disposed in the hollow space;
the acoustic wave device further includes an internal support layer in the hollow space and supporting the cover portion;
the acoustic wave device further includes:
a first conductive portion between the cover portion and the protective layer;
a wiring pattern on the piezoelectric substrate and electrically connected to at least one of the plurality of functional elements; and
a second conductive portion connecting the first conductive portion and the wiring pattern to each other;
in the protective layer, a through-hole to be filled with a conductor to electrically connect a connection terminal provided outside the acoustic wave device and the first conductive portion to each other is provided; and
when the acoustic wave device is seen in plan view, at least a portion of the through-hole overlaps the hollow space, and an end portion of the internal support layer overlaps an inner region of the through-hole.

16. An acoustic wave module comprising:
the acoustic wave device according to claim 15; and
a mount substrate on which the acoustic wave device is mounted.

17. An acoustic wave device comprising:
a piezoelectric substrate;
a functional element on the piezoelectric substrate;
an outer peripheral support layer on the piezoelectric substrate and surrounding a region in which the functional element is provided when the acoustic wave device is seen in plan view;
a cover portion supported by the outer peripheral support layer and disposed above the functional element;
a protective layer on the cover portion and including a portion in which a through-hole is provided;
a wiring electrode on the piezoelectric substrate and connected to the functional element;
a first conductive portion between the cover portion and the protective layer;
a second conductive portion connected to the wiring electrode and the first conductive portion;
a third conductive portion at least a portion of which is disposed in the through-hole and is connected to the first conductive portion; and
an internal support layer between the cover portion and the piezoelectric substrate in a region that is surrounded by the outer peripheral support layer when the acoustic wave device is seen in plan view; wherein
at least a portion of the internal support layer overlaps the through-hole when the acoustic wave device is seen in plan view.

18. The acoustic wave device according to claim 17, wherein a surface of the third conductive portion includes a portion that is lower than a surface of the protective layer in a thickness direction of the acoustic wave device.

19. The acoustic wave device according to claim 17, wherein a surface of the third conductive portion is at a same or substantially a same height as a surface of the protective layer in a thickness direction of the acoustic wave device.

20. An acoustic wave module comprising:
the acoustic wave device according to claim 17; and
a mount substrate on which the acoustic wave device is mounted.

* * * * *